United States Patent [19]
Marchese et al.

[11] Patent Number: 6,037,838
[45] Date of Patent: Mar. 14, 2000

[54] AMPLIFIER WITH PROGRAMMABLE GAIN AND INPUT LINEARITY USABLE IN HIGH-FREQUENCY LINES

[75] Inventors: Stefano Marchese, Pavia; Valerio Pisati, Bosnasco; Salvatore Portaluri; Alessandro Savo, both of Pavia, all of Italy

[73] Assignee: Stmicroelectronics S.r.l., Agrate Brianza, Italy

[21] Appl. No.: 09/264,296

[22] Filed: Mar. 8, 1999

[30] Foreign Application Priority Data

Mar. 31, 1998 [EP] European Pat. Off. ............... 98830192

[51] Int. Cl.⁷ .................................. H03F 3/45; H03G 7/00
[52] U.S. Cl. ................................ 330/254; 333/14
[58] Field of Search .................... 330/254, 259, 330/310; 333/14

[56] References Cited

U.S. PATENT DOCUMENTS

| | | | |
|---|---|---|---|
| 3,895,322 | 7/1975 | Stewart et al. | 333/14 |
| 3,972,010 | 7/1976 | Dolby | 333/14 |
| 5,589,791 | 12/1996 | Gilbert | 327/359 |
| 5,631,968 | 5/1997 | Frey et al. | 333/14 |

FOREIGN PATENT DOCUMENTS 0 369 469 A2  11/1989  European Pat. Off. ......... H03G 1/00
0 669 710 A2  2/1995   European Pat. Off. ......... H03G 1/00

OTHER PUBLICATIONS

Patent Abstracts of Japan, vol. 095, No. 008, Sep. 29, 1995, and JP 07 135432 A (Sharp Corp), May 23, 1995.

*Primary Examiner*—Robert Pascal
*Assistant Examiner*—Patricia T. Nguyen
*Attorney, Agent, or Firm*—Theodore E. Galanthay; Allen, Dyer, Doppelt, Milbrath & Gilchrist, P.A.

[57] ABSTRACT

An amplifier with programmable gain and input linearity at high frequency allows an increase in the gain without effecting input linearity and without significantly increasing current consumption. The amplifier includes an input stage which receives a voltage signal for performing a current conversion thereof with compression. An output stage is connected to the input stage and decompresses the signal provided by the input stage for producing gain amplification thereof. The amplifier further includes at least one current amplifier stage interposed between the input stage and the output stage. The at least one current amplifier includes at least one bipolar transistor series-connected to a load diode and to a current source. A reduction in the transconductance of the load diode is provided in the at least one amplifier stage to determine a programmable gain factor for the amplifier.

20 Claims, 4 Drawing Sheets

AMPLIFIER WITH PROGRAMMABLE GAIN AND INPUT LINEARITY USABLE IN HIGH-FREQUENCY LINES

FIELD OF THE INVENTION

The present invention relates to the field of electronics, and, more particularly, to an amplifier.

BACKGROUND OF THE INVENTION

Signal processing for digital video disk (DVD) applications, for example, conventionally requires amplifiers which can be programmed with a wide gain range, and are high performance in terms of the operating frequency. A data read channel is an example in which signal processing requires a gain-programmable amplifier.

FIG. 1 illustrates four signals A, B, C and D which have different amplitudes and are voltage-added in a node 1, and then amplified by an amplifier circuit 2 which sets the gain to obtain a sum signal. The sum signal is sent to an equalizer circuit 3 and finally to a buffer 4. The intended result is a dB linear gain variation with a linear variation of the current.

A gain setting circuit of the prior art is shown in FIG. 2, in which a differential input stage, designated by the reference numeral 10, is connected to a differential output stage, designated by the reference numeral 11. The gain $A_v$ is determined by a resistance ratio multiplied by a current ratio. The resistance ratio is determined by the ratio between the resistances of the output stage with respect to those of the input stage. The current ratio is the ratio between the current of the output stage and the current of the input stage. Accordingly, the gain $A_v$ is determined by the following relation:

$$A_v = \frac{R_L}{R_E} \cdot \frac{I_2}{I_1}$$

The above-described circuit is effective for gain programming since the gain can be changed not only by varying the resistive ratio, but also by primarily varying the current ratio. Varying the resistive ratio is difficult to implement, and in any case, requires a large circuit area. Varying the current ratio can be achieved easily with a modest use of the physical area of the device. Although the circuit of FIG. 2 is efficient for gain programmability, it is affected by drawbacks due to the high noise present at the output. The noise is amplified by the current ratio between the output stage and the input stage, and this is unacceptable whenever noise is a negative factor.

SUMMARY OF THE INVENTION

An object of the present invention is to provide an amplifier with programmable gain and input linearity usable in high-frequency lines, while increasing the gain without altering input linearity and without excessively increasing current consumption.

Another object of the present invention is to provide an amplifier with programmable gain and input linearity usable in high-frequency lines, wherein the gain of the amplifier is closely correlated to current variation.

A further object of the present invention is to provide an amplifier with programmable gain and input linearity usable in high-frequency lines, wherein the amplifier has high gain and high gain precision.

Yet another object of the present invention is to provide an amplifier with programmable gain and input linearity usable in high-frequency lines, wherein the amplifier is highly reliable, relatively easy to implement, and is produced at competitive costs.

These objects and others, which will become apparent hereinafter, are achieved by an amplifier with programmable gain and input linearity. The amplifier comprises an input stage for receiving a voltage signal and for performing current conversion thereof with compression. An output stage is connected to the input stage and decompresses the signal from the input stage, and produces gain amplification thereof. The amplifier further comprises at least one current amplifier stage interposed between the input stage and the output stage. The at least one current amplifier stage includes at least one bipolar transistor series-connected to a load diode and to a current source. A programmable circuit for reducing a transconductance of the load diode is provided in the at least one amplifier stage to determine a programmable gain factor of the amplifier.

BRIEF DESCRIPTION OF THE DRAWINGS

Further characteristics and advantages of the invention will become apparent from the description of the preferred, but not exclusive, embodiments of the programmable amplifier according to the invention, illustrated only by way of non-limitative examples in the accompanying drawings, wherein.

DETAILED DESCRIPTION OF THE PREFERRED EMBODIMENTS

Figure 1:
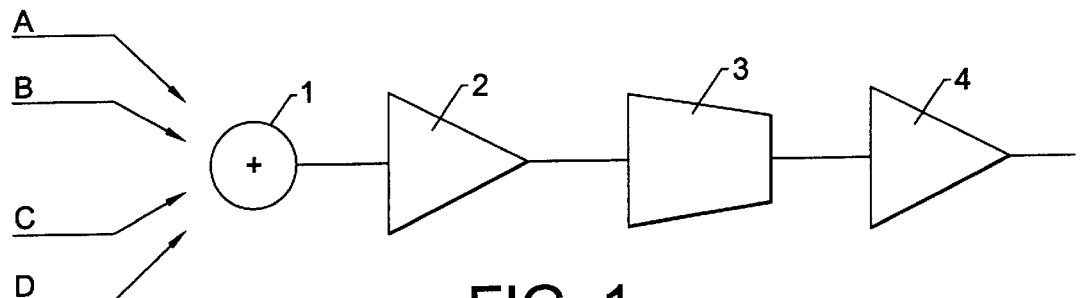
FIG. 1 is a conceptual diagram of a data read channel according to the prior art.
Figure 2:
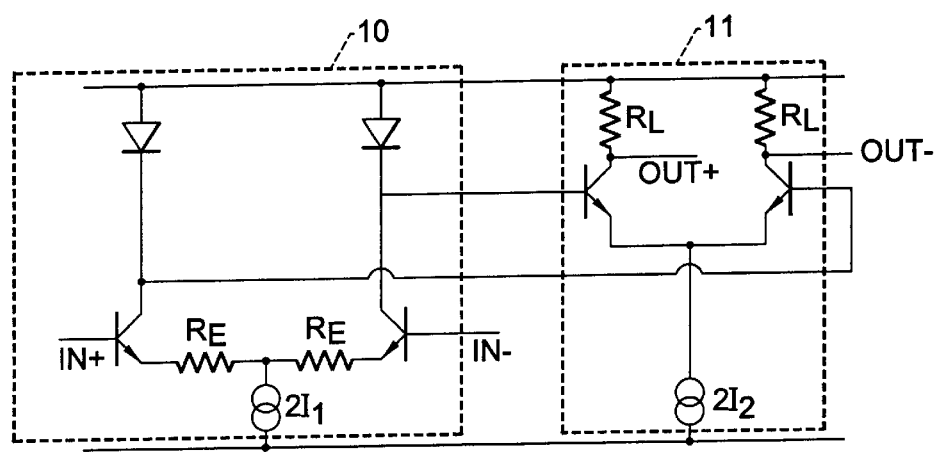
FIG. 2 is a circuit diagram of a programmable amplifier according to the prior art.
Figure 3:
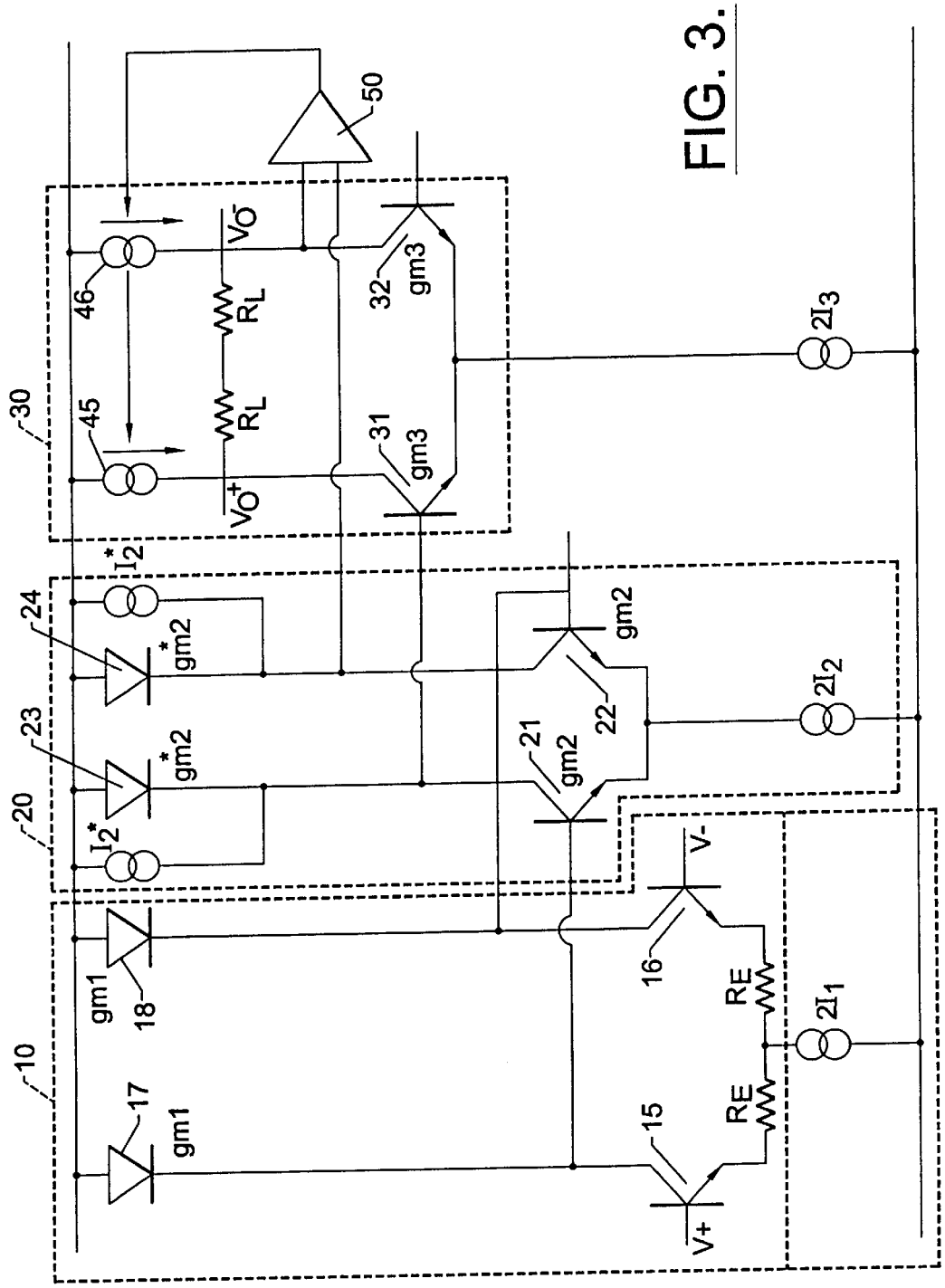
FIG. 3 is a circuit diagram of a gain-programmable amplifier according to the present invention.

The programmable amplifier according to the present invention is described in detail with reference to FIGS. 3 to 5. Referring to FIG. 3, the circuit according to the invention comprises a first differential input stage 10 which is similar to the differential input stage shown in FIG. 2. The first differential input stage 10 comprises a first bipolar transistor 15 and a second bipolar transistor 16, which are arranged so that their emitter terminals are connected to respective resistors $R_E$ and their collector terminals are connected to respective diodes 17 and 18. A current source $2I_1$ is connected to a common node between the resistors $R_E$.

The first differential input stage 10 is connected to at least one current amplifier stage, designated by the reference numeral 20. The at least one current amplifier stage 20 is interposed between the differential input stage 10 and a differential output stage 30. A differential stage is shown, but the circuit according to the invention is equally valid if a single-input stage or a single-output output stage is used.

The current amplifier stage 20 is formed by a first bipolar transistor 21 and by a second bipolar transistor 22 having common-connected emitter terminals. A current source $2I_2$ is connected to the emitter terminals. The base terminals of the bipolar transistors 21 and 22 are respectively connected to the collector terminals of the transistors 15 and 16. Voltage signals V⁺ and V⁻ are applied to the base terminals of the transistors 15 and 16 of the first differential input stage. The collector terminals of the transistors 21 and 22 are connected, respectively, to diodes 23 and 24, wherein the anode terminal is connected to the collector terminal of the respective transistors. Respective current sources $I_2^*$ are parallel-connected to the diodes 23 and 24.

Finally, the second stage, i.e., the current amplifier stage 20, is connected to the output stage. The current amplifier stage 20 is also of the differential type, and the same considerations previously discussed equally apply. The differential output stage 30 is formed by two transistors 31 and 32. The emitter terminals are common-connected, including connection to a current source $2I_3$. The collector terminals of the transistors 31 and 32 are respectively connected to resistors $R_L$. The base terminals of the bipolar transistors 31 and 32 are respectively connected to the collector terminals of the transistors 21 and 22 of the current amplifier stage 20.

The above-described circuit has a gain which is given by:

$$A_v = \frac{R_L}{R_E} \cdot \frac{gm2}{gm1} \cdot \frac{gm3}{gm2^*}$$

from which:

$$A_v = \frac{R_L}{R_E} \cdot \frac{I_2}{I_1} \cdot \frac{I_3}{I_2 - I_2^*} = \frac{R_L}{R_E} \cdot \frac{I_3}{I_1} \cdot \frac{I_2}{I_2 - I_2^*}$$

The input stage 10 receives at an input a air of voltage signals and converts them into current signals, and compresses them. The signals are sent to the second current amplifier stage 20, which amplifies the gain and then sends the amplified signals to the differential output stage 30. The differential output stage 30 converts the amplified signals back to voltage signals to provide a voltage output. It is also possible to have a current output, which is useful, for example, when the output is applied to other filters.

The transconductance of the diodes 23 and 24 of the second current amplifier stage 20 can be modulated by varying the static current supplied by the sources $I_2^*$, which is independent of the current of the input stage 10. Thus, by significantly increasing the static current, it is possible to increase the gain because the transconductance decreases. Accordingly, a further degree of freedom to increase the gain is obtained in addition to the one provided by varying the currents of the differential input and output stages, i.e., currents $I_1$ and $I_3$.

The current sources $I_2^*$ therefore subtract static current from the diodes 23 and 24, which allows a reduction in the transconductances of the diodes 23 and 24. It is thus possible to mutually cascade-connect a plurality of current amplifier stages 20 between the differential input stage 10 and the differential output stage 30 to have a cascade of a plurality of gain factors provided by a current ratio in which the static current of the sources $I_2^*$ is present.

In the above defined gain equation, gm1, gm2, gm3 and gm2* are, respectively, the transconductances of diodes 17 and 18, of transistors 21 and 22, of diodes 23 and 24, and of transistors 31 and 32. Therefore, by varying the currents included in the gain equation, it is possible to change the gain. To achieve a high gain, it is possible to have a small current $I_1$. However, a limit is set by input linearity, which is determined by $2I_1R_E$. An alternative would be to increase the current $I_3$. But in this case, the power dissipated by the circuit also increases.

The intermediate current amplifier stage 20 allows a gain increase without changing input linearity and without excessively increasing current absorption. The term $$\frac{I_2}{I_2 - I_2^*}$$

can be varied continuously or stepwise by changing the current $I_2^*$. The limit of the above-described structure prevents the term $I_2 - I_2^*$ from becoming smaller than 0. In this case, the load diodes of the second stage 20, i.e., the diodes 23 and 24, switch off and the linear region is avoided. As mentioned, it is possible to introduce a plurality of stages like the one illustrated above to further increase the gain.

Figure 4:
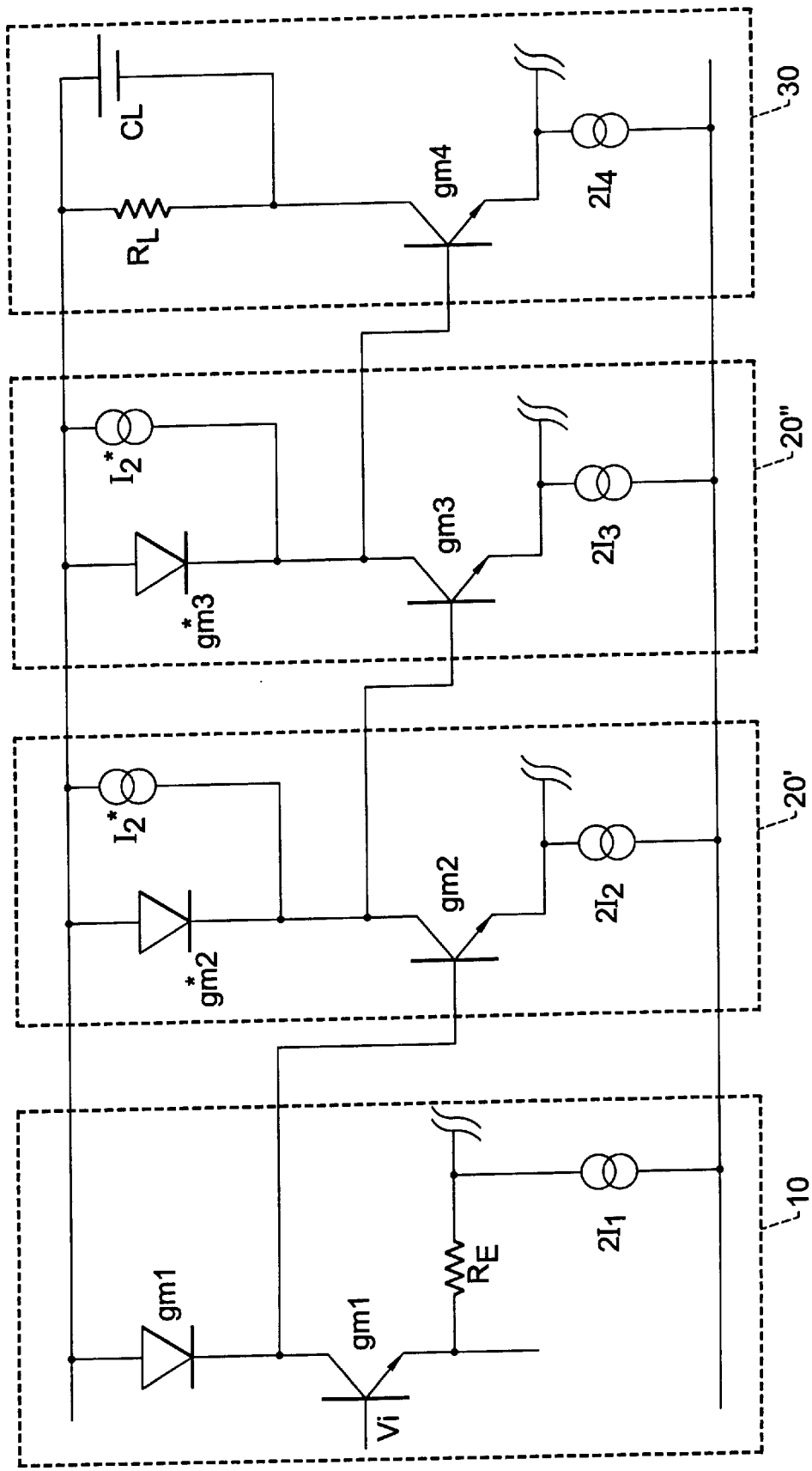
FIG. 4 is a circuit diagram of a second embodiment of a gain-programmable amplifier according to the present invention.

FIG. 4 is a partial circuit diagram in which only one branch of the corresponding differential circuits is illustrated, with the second branch being omitted. The diagram illustrates a circuit in which two current amplifier stages are interposed between the differential input stage 10 and the differential output stage 30. The amplifier stages are now designated by the reference numerals 20' and 20", and are provided, according to the invention, like the stage 20 shown in FIG. 3. In this case, gm4 is the transconductance of the bipolar transistors of the output stage 30, while gm3 and gm3* are, respectively, the transconductances of the bipolar transistors and of the diodes of the second current amplifier stage 20". Therefore, according to the circuit of FIG. 4, the gain of the circuit is:

$$A_v = \frac{R_L}{R_E} \cdot \frac{gm2}{gm1} \cdot \frac{gm3}{gm2^*} \cdot \frac{gm4}{gm3^*}$$

from which:

$$A_v = \frac{R_L}{R_E} \cdot \frac{I_2}{I_1} \cdot \frac{I_3}{I_2 - I_2^*} \cdot \frac{I_4}{I_3 - I_3^*}$$

$$A_v = \frac{R_L}{R_E} \cdot \frac{I_4}{I_1} \cdot \frac{I_2}{I_2 - I_2^*} \cdot \frac{I_3}{I_3 - I_3^*}$$

If the currents are chosen so that their value is not too small, the output impedance of each stage is low. Therefore, the entire structure operates like a single-pole amplifier having a transfer function equal to:

$$H(S) = \frac{A_v}{1 + SR_L C_L}$$

The secondary poles are due to the impedance of the diodes and to the parasitic capacitors that occur on the respective nodes, and are thus localized at high frequencies. This is true if the transconductance of the diodes is kept relatively high.

FIG. 4 illustrates a capacitor $C_L$ representing a load capacitance due to a load connected to the amplifier according to the invention. If the current $I_4$ of the differential output stage 30 is changed exponentially, it is possible to achieve dB linear gain control. The above-described circuit has also been optimally used at high frequencies.

Figure 5:
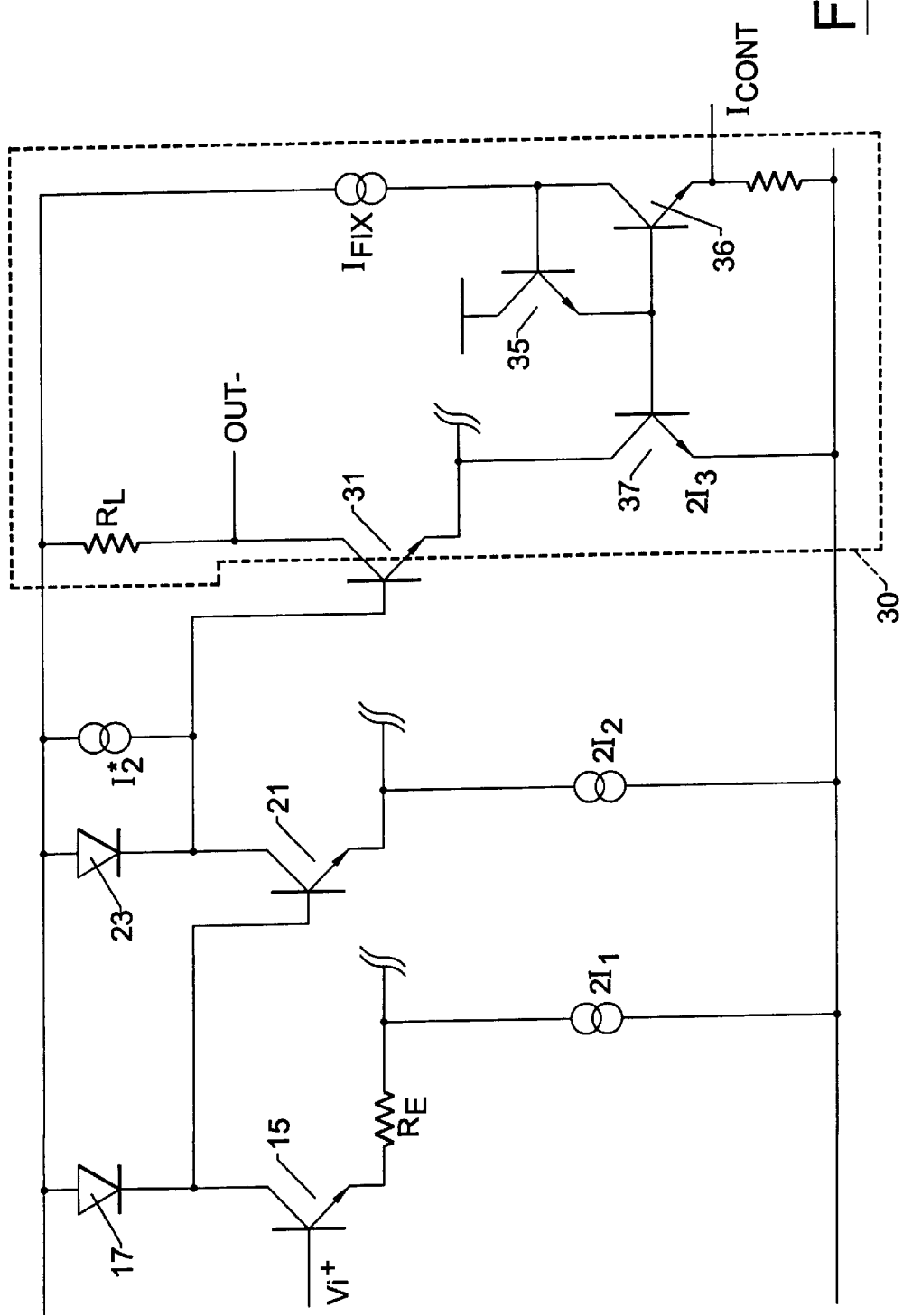
FIG. 5 is a circuit diagram of a third embodiment of the gain-programmable amplifier according to the present invention.

The circuit shown in FIG. 5 shows the introduction of a control current $I_{cont}$ in the differential output stage. This allows an exponential variation of the current $2I_3$ by varying the control current $I_{cont}$ in a linear fashion. Accordingly, the gain of the amplifier also varies exponentially in this case. The differential output stage 30 is formed by a modified current mirror, as shown in FIG. 5, in which an additional bipolar transistor 35 is provided. The transistor 35 is connected by its base terminal to the collector terminal of a transistor 36 which receives, on its emitter terminal, the control current $I_{cont}$. The transistor 36 is connected to the transistor 37 by its base terminal.

If the current $I_3$ varies to change the gain, the common-mode voltage at the output from the stage 30 changes. Accordingly, it can be useful to have a common-mode circuit, as designated by the reference numeral 50 and as shown in FIG. 3. The common-mode circuit 50 is an amplifier having a reference voltage and receives at an input the voltages received on the collectors of the transistors 31 and 32, and provides feedback control at an output of current sources 45 and 46. The amplifier thus controls the half-sum of the inputs provided by the collectors of the transistors 31 and 32, and compares the half-sum with the reference voltage to generate an error signal, and to control the current sources 45 and 46. The half-sum of the voltages at an input to the common-mode circuit 50 must be equal to the reference voltage. In this case, the circuit 50 does not operate using the current sources 45 and 46.

The programmable amplifier according to the invention fully achieves the objects since the gain can be programmed while maintaining input linearity. It is also possible to achieve a high gain amplifier with high precision of the gain simultaneously with high performance in terms of the operating frequency. This is due to the fact that frequency compensation is simpler than a circuit solution in which a cascade of voltage-gain stages is present. All of the secondary poles are associated with low impedances, and therefore with a high frequency. Low impedances can be achieved because it is not necessary to provide voltage gain in the internal nodes of the circuit.

Finally, the circuit according to the invention achieves low power dissipation and provides a current output which is useful for applying, for example, to the other filters. Numerous modifications and variations can be made to the amplifier, all of which are within the scope of the invention. All the details may also be replaced with other technically equivalent elements. The materials used may be any according to requirements and to the state of the art, so long as they are compatible with the specific use.

That which is claimed is:

1. An amplifier comprising:
   an input stage having an input for receiving a voltage signal, said input stage for converting the voltage signal into a compressed current signal;
   an output stage connected to said input stage for receiving and decompressing the compressed current signal producing gain amplification thereof; and
   at least one current amplifier stage interposed between said input and output stages, said at least one current amplifier stage comprising
   at least one load diode,
   at least one current source,
   at least one bipolar transistor series-connected to said at least one load diode and to said at least one current source, and
   a programmable circuit for reducing a transconductance of said load diode for determining a programmable gain factor for amplifying the compressed current signal.

2. An amplifier according to claim 1, wherein said programmable circuit comprises a static current source parallel-connected to said load diode.

3. An amplifier according to claim 2, wherein said at least one current amplifier stage, said current source and said static current source produce the programmable gain factor, wherein the programmable gain factor is programmed by varying a static current of said static current source.

4. An amplifier according to claim 1, wherein said input stage, said output stage and said at least one current amplifier stage are differential stages.

5. An amplifier according to claim 4, wherein said output stage comprises:
   a pair of load resistors; and
   a pair of current sources parallel-connected to said pair of load resistors.

6. An amplifier according to claim 5, further comprising a common-mode feedback circuit having an input for receiving differential voltage signals provided at an output of said output stage, said common-mode feedback circuit for comparing the differential voltage signals with a reference voltage for generating a signal for driving said pair of current sources of said output stage.

7. An amplifier according to claim 4, wherein said input stage comprises:
   a pair of transistors arranged in a mirror configuration, each transistor having a collector terminal connected to a base terminal of a respective bipolar transistor of said at least one current amplifier stage; and
   a diode connected to a respective collector terminal of said pair of transistors.

8. An amplifier according to claim 7, wherein said input stage comprises a resistor connected to a respective emitter terminal of each transistor of said pair of transistors.

9. An amplifier comprising:
   an input stage having an input for receiving a voltage signal, said input stage for converting the voltage signal into a compressed current signal;
   an output stage connected to said input stage for receiving and decompressing the compressed current signal producing gain amplification thereof; and
   at least one current amplifier stage interposed between said input and output stages, said at least one current amplifier stage comprising
   at least one load diode,
   at least one current source,
   at least one bipolar transistor series-connected to said at least one load diode and to said at least one current source, and
   a static current source parallel-connected to said load diode for reducing a transconductance of said load diode for determining a programmable gain factor for amplifying the compressed current signal.

10. An amplifier according to claim 9, wherein said at least one current amplifier stage, said current source and said static current source produce the programmable gain factor, wherein the programmable gain factor is programmed by varying a static current of said static current source.

11. An amplifier according to claim 9, wherein said input stage, said output stage and said at least one current amplifier stage are differential stages.

12. An amplifier according to claim 11, wherein said output stage comprises:
   a pair of load resistors; and
   a pair of current sources parallel-connected to said pair of load resistors.

13. An amplifier according to claim 12, further comprising a common-mode feedback circuit having an input for receiving differential voltage signals provided at an output of said output stage, said common-mode feedback circuit for comparing the differential voltage signals with a reference voltage for generating a signal for driving said pair of current sources of said output stage.

14. An amplifier according to claim 11, wherein said input stage comprises:
   a pair of transistors arranged in a mirror configuration, each transistor having a collector terminal connected to a base terminal of a respective bipolar transistor of said at least one current amplifier stage; and
   a diode connected to a respective collector terminal of said pair of transistors.

15. An amplifier according to claim 14, wherein said input stage comprises a resistor connected to a respective emitter terminal of each transistor of said pair of transistors.

16. A method for programming a programmable gain amplifier, the method comprising the steps of:
   converting a voltage signal received at an input stage into a compressed current signal;
   receiving the compressed current signal at an output stage and decompressing the compressed current signal for producing gain amplification thereof; and
   providing a programmable gain factor between the input and output stages for the compressed current signal.

17. A method according to claim 16, wherein the step of providing a programmable gain factor is determined using at least one current amplifier stage interposed between the input and output stages.

18. A method according to claim 17, further comprising the step of reducing a transconductance of a load diode in the at least one current amplifier stage for determining the programmable gain factor for the compressed current signal.

19. A method according to claim 18, wherein the at least one amplifier stage comprises at least one bipolar transistor series-connected to a load diode and to a current source, and a static current source parallel-connected to the load diode; wherein the step of providing a programmable gain factor comprises determining a current ratio of the at least one current amplifier stage, the current ratio being determined by a ratio between a current set by the current source and a difference between the current and a static current set by the static current source.

20. A method according to claim 19, wherein the static current is set according to a switch-off point of the load diode, and to a predetermined frequency response performance.

* * * * *